(12) United States Patent
Moon

(10) Patent No.: US 7,120,221 B2
(45) Date of Patent: Oct. 10, 2006

(54) SHIFT REGISTER

(75) Inventor: Su Hwan Moon, Kyongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 18 days.

(21) Appl. No.: 10/988,860

(22) Filed: Nov. 15, 2004

(65) Prior Publication Data

US 2005/0220262 A1    Oct. 6, 2005

(30) Foreign Application Priority Data

Mar. 31, 2004    (KR)    ...................... 10-2004-0021987

(51) Int. Cl.
*G11C 19/00* (2006.01)
(52) U.S. Cl. ............................. 377/64; 377/79; 345/100
(58) Field of Classification Search ...................... None
See application file for complete search history.

(56) References Cited

U.S. PATENT DOCUMENTS

2005/0220263 A1* 10/2005 Moon ........................... 377/68

2005/0264514 A1* 12/2005 Kim et al. ................... 345/100
2006/0007085 A1* 1/2006 Kim et al. ..................... 345/87

* cited by examiner

*Primary Examiner*—Tuan T. Lam
(74) *Attorney, Agent, or Firm*—Brinks Hofer Gilson & Lione

(57) ABSTRACT

An output buffer in each stage of a shift register applies a first clock signal to an output line under control of a first node and a second driving voltage to the output line under control of second and third nodes. A first node controller controls the first node using a start pulse and an output signal of the next stage. A second node controller selectively applies a voltage at a fourth node and the second driving voltage to the second node under control of the first and second clock signals. A third node controller applies the voltage at the fourth node and the second driving voltage to the third node opposite to the second node. A fourth node controller controls the fourth node such that the fourth node has a voltage opposite to the first node using a voltage at the first node and the first driving voltage.

31 Claims, 7 Drawing Sheets

SHIFT REGISTER

This application claims the benefit of Korean Patent Application No. P2004-21987 filed in Korea on Mar. 31, 2004, which is hereby incorporated by reference.

BACKGROUND

1. Field of the Invention

This invention relates to a driving circuit for a liquid crystal display, and more particularly to a shift register employing an amorphous silicon thin film transistor.

2. Description of the Related Art

Generally, a liquid crystal display (LCD) used as a display device for a television or a computer controls light transmittance of a liquid crystal using an electric field to thereby display a picture. To this end, the LCD includes a liquid crystal display panel having liquid crystal cells arranged in a matrix type, and a driving circuit for driving the liquid crystal display panel.

In the liquid crystal display panel, gate lines and data lines are arranged to intersect each other. The liquid crystal cell is positioned at each area defined by intersections between the gate lines and the data lines. The liquid crystal display panel is provided with pixel electrodes and a common electrode for applying an electric field to each liquid crystal cell. Each of the pixel electrodes is connected, via source and drain terminals of a thin film transistor as a switching device, to one of the data lines. A gate terminal of the thin film transistor is connected to one of the gate lines.

The driving circuit includes a gate driver for driving the gate lines and a data driver for driving the data lines. The gate driver sequentially applies a scanning signal to the gate lines to sequentially drive the liquid crystal cells on the liquid crystal display panel. The data driver applies a video signal to each data line whenever the scanning signal is applied to one of the gate lines. Thus, the LCD controls light transmittance by an electric field applied between the pixel electrode and the common electrode in accordance with a video signal for each liquid crystal cell, thereby displaying a picture.

In such a driving circuit, the gate driver generates a scanning signal for sequentially driving the gate lines using a shift register. The data driver generates a sampling signal for sequentially sampling video signals inputted from the exterior thereof by a specific unit using the shift register.

FIG. 1 is a block diagram showing a configuration of a general two-phase shift register.

Referring to FIG. 1, the shift register includes 1st to nth stages connected in cascade. The 1st to nth stages are commonly supplied with first and second clock signals C1 and C2 along with high-level and low-level driving voltages (not shown), and are supplied with a start pulse Vst or an output signal of the previous stage. The 1st stage outputs a first output signal Out1 in response to the start pulse Vst and the first and second clock signals C1 and C2. The 2nd to nth stages output 2nd to nth output signals, respectively, in response to the output signal of the previous stage and the first and second clock signals C1 and C2. The 1st to nth stages have an identical circuit configuration, and sequentially shift a specific voltage of the start pulse Vst. The 1st to nth output signals Out1 to Outn are supplied with a scanning signal for sequentially driving the gate lines of the liquid crystal display panel, or with a sampling signal for sequentially sampling a video signal within the data driver.

FIG. 2 shows a detailed circuit configuration of one stage shown in FIG. 1.

In FIG. 2, the stage includes a fifth NMOS transistor T5 for outputting a first clock signal C1 to an output line under control of a Q node, a sixth NMOS transistor T6 for outputting a low-level driving voltage VSS under control of a QB node, and first to fourth NMOS transistors T1 to T4 for controlling the Q node and the QB node.

Such a stage is supplied with high-level and low-level voltages VDD and VSS, and with the start pulse Vst and the first and second clock signals C1 and C2. Herein, the second clock signal C2 is a signal in which a high-state voltage and a low-state voltage each having a predetermined pulse width are alternately supplied, whereas the first clock signal C1 is a signal having a voltage opposite to the second clock signal C2. A high state of the start pulse Vst is synchronized with a high state of the second clock signal C2. The start pulse Vst is a signal supplied from the exterior or an output signal of the previous stage.

Hereinafter, an operation procedure of the stage will be described with reference to driving waveforms shown in FIG. 3.

In an A period, the first NMOS transistor T1 is turned on by a high-state second clock signal C2 to thereby apply a high-state voltage of the start pulse Vst to the Q node, that is, to pre-charge it. The high-stage voltage pre-charged to the Q node turns on the fifth NMOS transistor T5 to thereby apply a low-state voltage of the first clock signal to the output line. At this time, the second NMOS transistor T2 also is turned on by the high-state second clock signal to thereby apply a high-level driving voltage VDD to the QB node. Then, the high-level driving voltage VDD supplied to the QB node turns on the sixth NMOS transistor T6 to thereby supply a low-level driving voltage VSS. Thus, in the A period, the output line of the stage outputs a low-state output signal OUT.

In a B period, the first NMOS transistor T1 is turned off by a low-state second clock signal C2 to thereby float the Q node into a high state. Thus, the fifth NMOS transistor T5 keeps a turn-on state. At this time, as a high-state voltage is supplied as the first clock signal C1, the floated Q node is boot-strapped by an affect of an internal capacitor Cgs provided between the gate and the drain of the fifth NMOS transistor T5 and a capacitor CB. Accordingly, a voltage at the Q node is further raised to keep the fifth NMOS transistor T5 turned on, thereby rapidly supplying a high-state voltage of the first clock signal C1 to the output line. Further, the Q node floated into a high state turns on the fourth NMOS transistor T4 and a high-state first clock signal C1 turns on the third NMOS transistor T3 to supply the low-level driving voltage VSS to the QB node, thereby turning off the sixth NMOS transistor T6. Thus, in the B period, the output line of the stage outputs a high-state output signal OUT.

In a C period, the first NMOS transistor T1 is turned on by a high-state second clock signal C2 to supply a low-state voltage of the start pulse Vst to the Q node, thereby turning off the fifth NMOS transistor T5. At this time, the second NMOS transistor T2 is turned on by a high-state second clock signal C2 to supply the high-level driving voltage VDD to the QB node, thereby turning on the sixth NMOS transistor T6 to output the low-level driving voltage VSS to the output line. At this time, the third NMOS transistor T3 is turned off by a low-stage first clock signal C1 and the fourth NMOS transistor T4 is turned off by the low-state Q node, thereby keeping the high-level driving voltage VDD at the QB node. Thus, in the C period, the output line of the stage outputs a low-state output signal OUT.

In a D period, the second NMOS transistor T2 is turned off by a low-state second clock signal C2 and the fourth NMOS transistor T4 is turned off by the low-state Q node, thereby floating the QB node with keeping the high-level driving voltage VDD supplied in the previous period C even though the third NMOS transistor T3 is turned on by a high-state first clock signal C1. Thus, the sixth NMOS transistor T6 keeps a turn-on state to thereby output the low-level driving voltage VSS to the output line. As a result, in the D period, the output line of the stage outputs a low-state output signal OUT.

In the remaining period, the C and D periods are alternately repeated, so that the output signal OUT of the stage continuously keeps a low state.

Recently, various attempts have been made to apply a polycrystalline silicon thin film transistor capable of directly forming a shift register on a glass substrate to an amorphous silicon thin film transistor. However, the amorphous silicon thin film transistor has a bias temperature stress characteristic in which it operates erroneously due to bias stress when a direct current (DC) voltage is continuously supplied to the gate terminal thereof in a high temperature operation.

In a conventional shift register, a DC-type high-level driving voltage VDD is applied to the QB node that is a gate node of the sixth NMOS transistor during a majority of period (i.e., during the remaining period other than 1H or 2H interval at which the Q node has a high state) as shown in FIG. 3. Accordingly, the conventional shift register has a problem in that, when it is operated at a high temperature, the sixth NMOS transistor T6 is erroneously operated due to gate bias stress.

SUMMARY

By way of introduction only, in one embodiment a shift register has a plurality of stages for shifting an input start pulse using first and second driving voltages and first and second clock signals to apply the shifted start pulse as each output signal and a next stage start pulse. In this embodiment, each stage includes an output buffer for applying the first clock signal to an output line under control of a first node and for applying the second driving voltage to the output line under control of second and third nodes; a first node controller for controlling the first node using the start pulse and an output signal of the next stage; a second node controller for selectively applying a voltage at a fourth node and the second driving voltage to the second node under control of the first and second clock signals; a third node controller for applying the voltage at the fourth node and the second driving voltage to the third node that is opposite to the second node under control of the first and second clock signals; and a fourth node controller for controlling the fourth node such that the fourth node has a voltage opposite to the first node using a voltage at the first node and the first driving voltage.

In the shift register, the first and second clock signals have phases that are inverted with respect to each other.

The first and second clock signals are alternately applied to the plurality of stages.

The first driving voltage is higher than the second driving voltage.

The first node controller includes a first transistor connected between an input line of the first driving voltage and the first node, the first transistor controlled by the start pulse; and a second transistor connected between an input line of the second driving voltage and the first node, the second transistor controlled by an output signal of the next stage.

The fourth node controller includes a third transistor connected between the input line of the first driving voltage and the fourth node, the third transistor connected so as to operate as a diode; and a fourth transistor connected between the fourth node and the input line of the second driving voltage, the fourth transistor controlled by the first node.

Herein, the fourth transistor is larger than the third transistor.

A magnitude ratio of the third transistor to the fourth transistor is approximately 1:3.

The output buffer includes a fifth transistor connected between the input line of the first clock signal and the output line of the stage, the fifth transistor controlled by the first node; a sixth transistor connected between the output line of the stage and the input line of the second driving voltage, the sixth transistor controlled by the second node; and a seventh transistor connected in parallel to the sixth transistor, the seventh transistor controlled by the third node.

The output buffer includes a capacitor connected to the fifth transistor to bootstrap the first node using the first clock signal.

The second node controller includes an eighth transistor connected between the fourth node and the second node, the eight transistor controlled by the first clock signal; and a ninth transistor connected between the input line of the second driving voltage and the second node, the ninth transistor controlled by the second clock signal.

The third node controller includes a tenth transistor connected between the fourth node and the third node, the tenth transistor controlled by the second clock signal; and an eleventh transistor connected between the input line of the second driving voltage and the third node, the eleventh transistor controlled by the second clock signal.

The first node controller includes a twelfth transistor connected between the first node and the input line of the second driving voltage, the twelfth transistor controlled by the second node; and a thirteenth transistor connected, in parallel, to the twelfth transistor, the thirteenth transistor controlled by the third node.

The stage is configured by the same channel-type transistor.

The stage is configured by NMOS transistors.

The stage is configured by an amorphous-silicon thin film transistor.

In another embodiment, a current stage of the shift register comprises multiple controllers controlled using the input start pulse, an output signal of a next stage, the clock signals, the driving voltages, or a voltage at one of multiple nodes internal to the current stage, means for limiting a voltage supplied to each controller and time that the voltage is supplied to each controller to a voltage and time less than that causing bias stress on the controller, and a buffer that supplies one of the clock signals as an output signal during a particular period.

The limiting means limits the voltage to at most as large as about one of the driving voltages and the time to at most about that of one clock pulse.

In another embodiment, a method of providing a shifted input start pulse from a shift register having a current stage and a next stage comprises: applying multiple driving voltages and clock signals as well as an input start pulse to the current stage of the shift register; controlling a buffer to supply one of the clock signals as an output signal of the current stage or to restrain the one of the clock signals from being supplied as the output signal of the current stage; controlling multiple controllers in the current stage using the input start pulse, an output signal of the next stage, the clock signals, the driving voltages, or a voltage at one of multiple nodes internal to the current stage; for each controller: limiting a voltage supplied to the controller and limiting time that the voltage is supplied to the controller to a voltage and time less than that causing bias stress on the controller; and shifting the input start pulse in time and supplying the shifted input start pulse as the output signal of the current stage to an input start pulse of the next stage.

The method further comprises, for each controller: limiting the voltage supplied to the controller to a voltage that is at most as large as about one of the driving voltages and limiting the time the voltage is supplied to the controller to at most about that of one clock pulse.

BRIEF DESCRIPTION OF THE DRAWINGS

The following detailed description of the embodiments of the present invention reference the accompanying drawings, in which.

DETAILED DESCRIPTION

Reference will now be made in detail to the preferred embodiments of the present invention, examples of which are illustrated in the accompanying drawings.

Hereinafter, the preferred embodiments of the present invention will be described in detail with reference to FIGS. 4 and 7.

Figure 1:
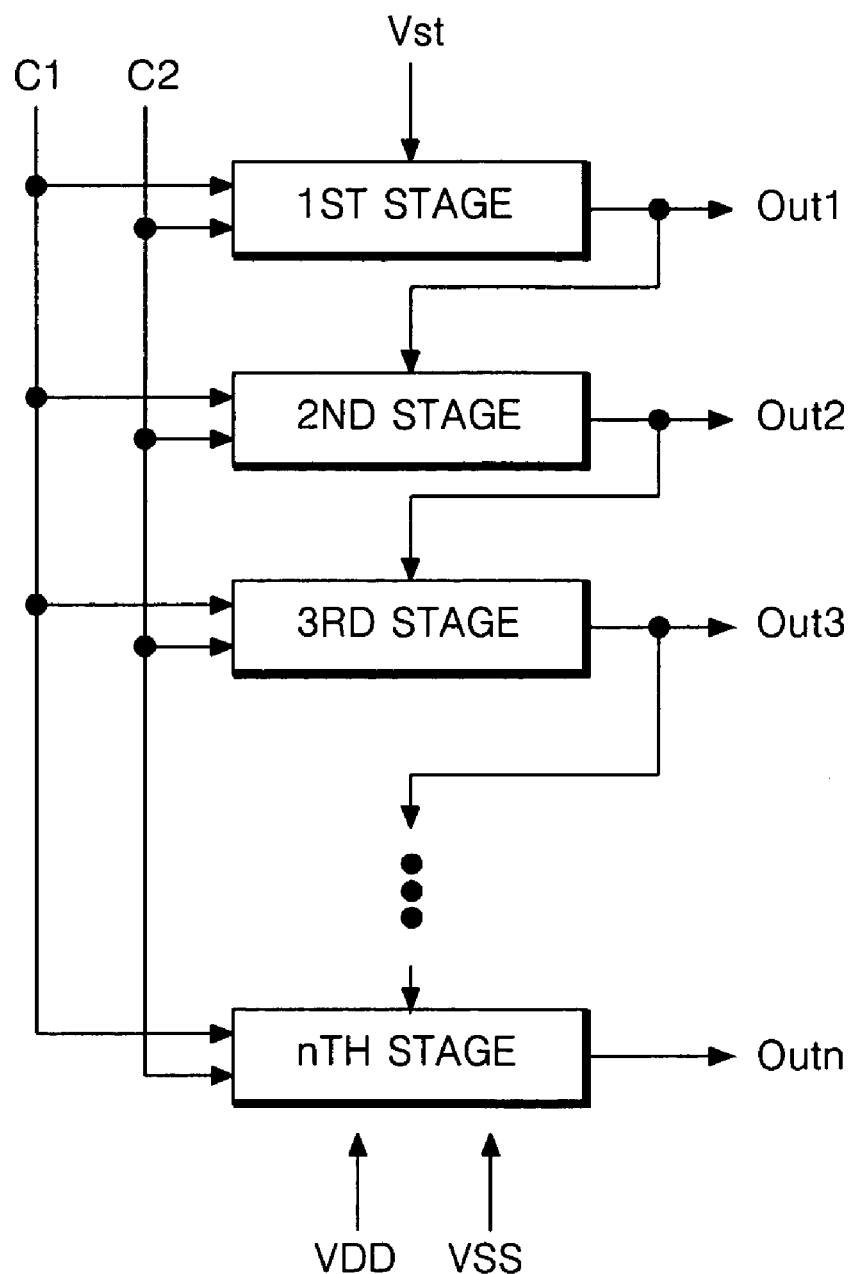
FIG. 1 is a schematic block diagram showing a configuration of a conventional bi-phase shift register.
Figure 2:
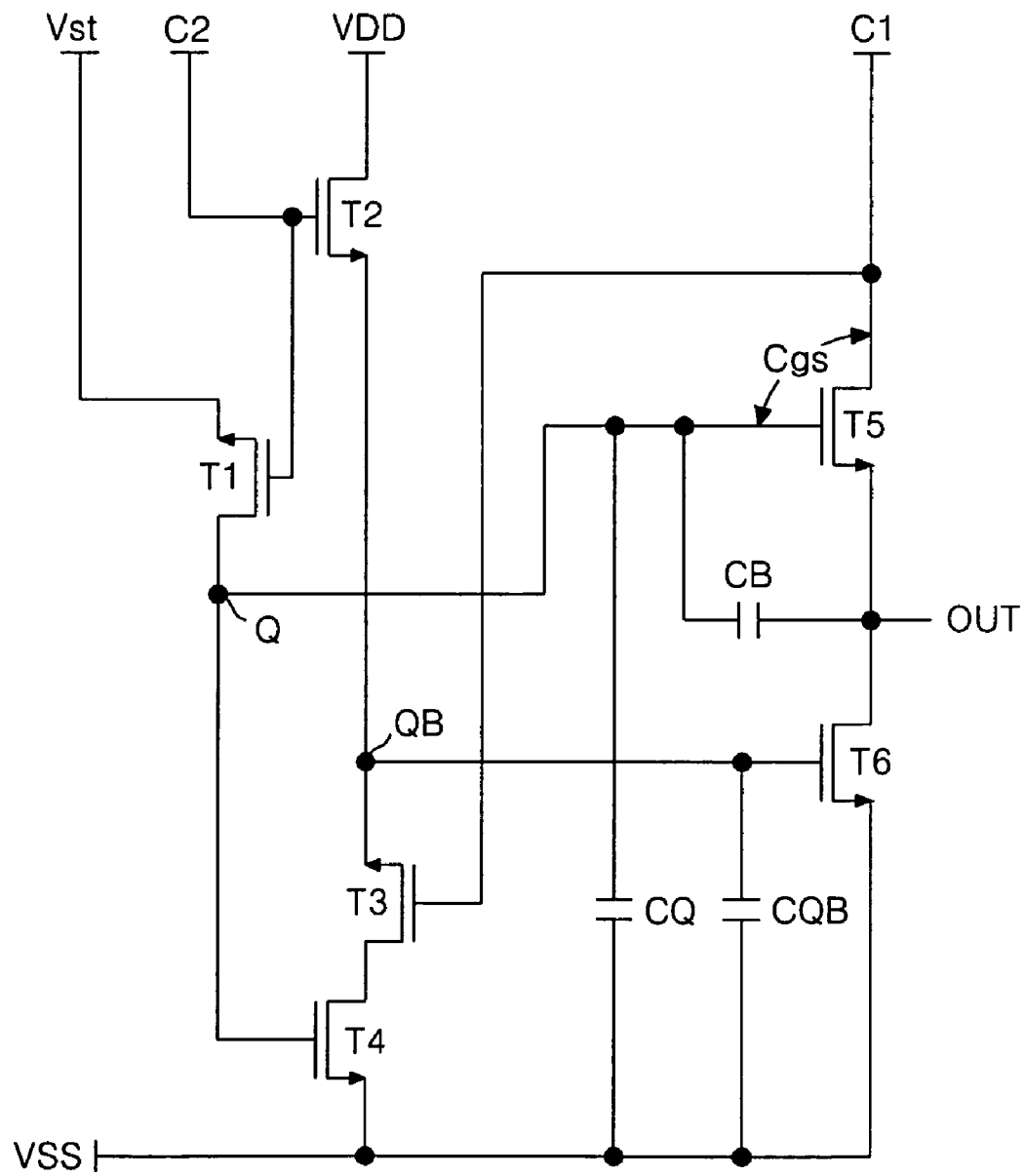
FIG. 2 is a detailed circuit diagram of the first stage shown in FIG. 1.
Figure 3:
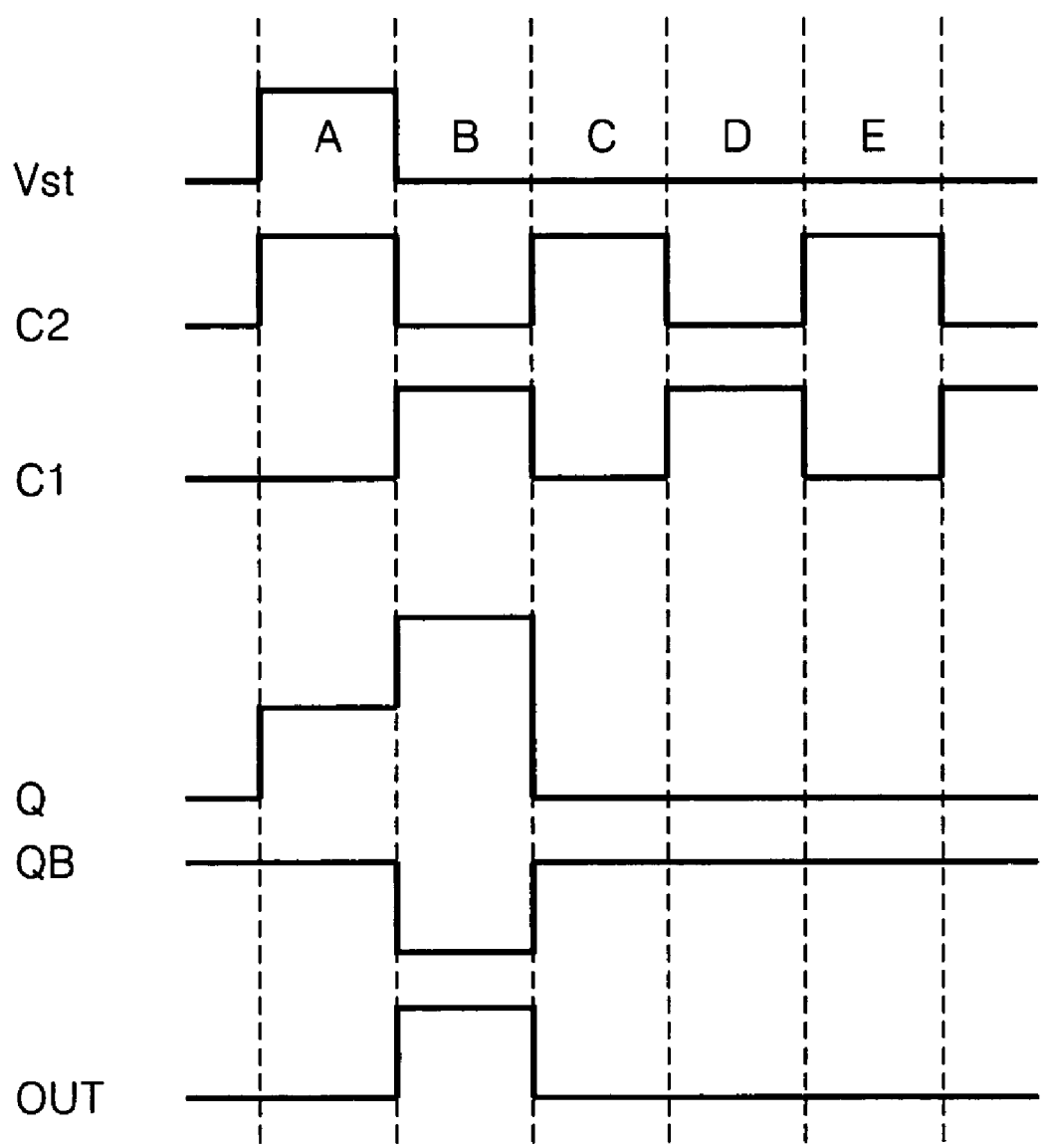
FIG. 3 is a driving waveform diagram of the stage shown in FIG. 2.
Figure 4:
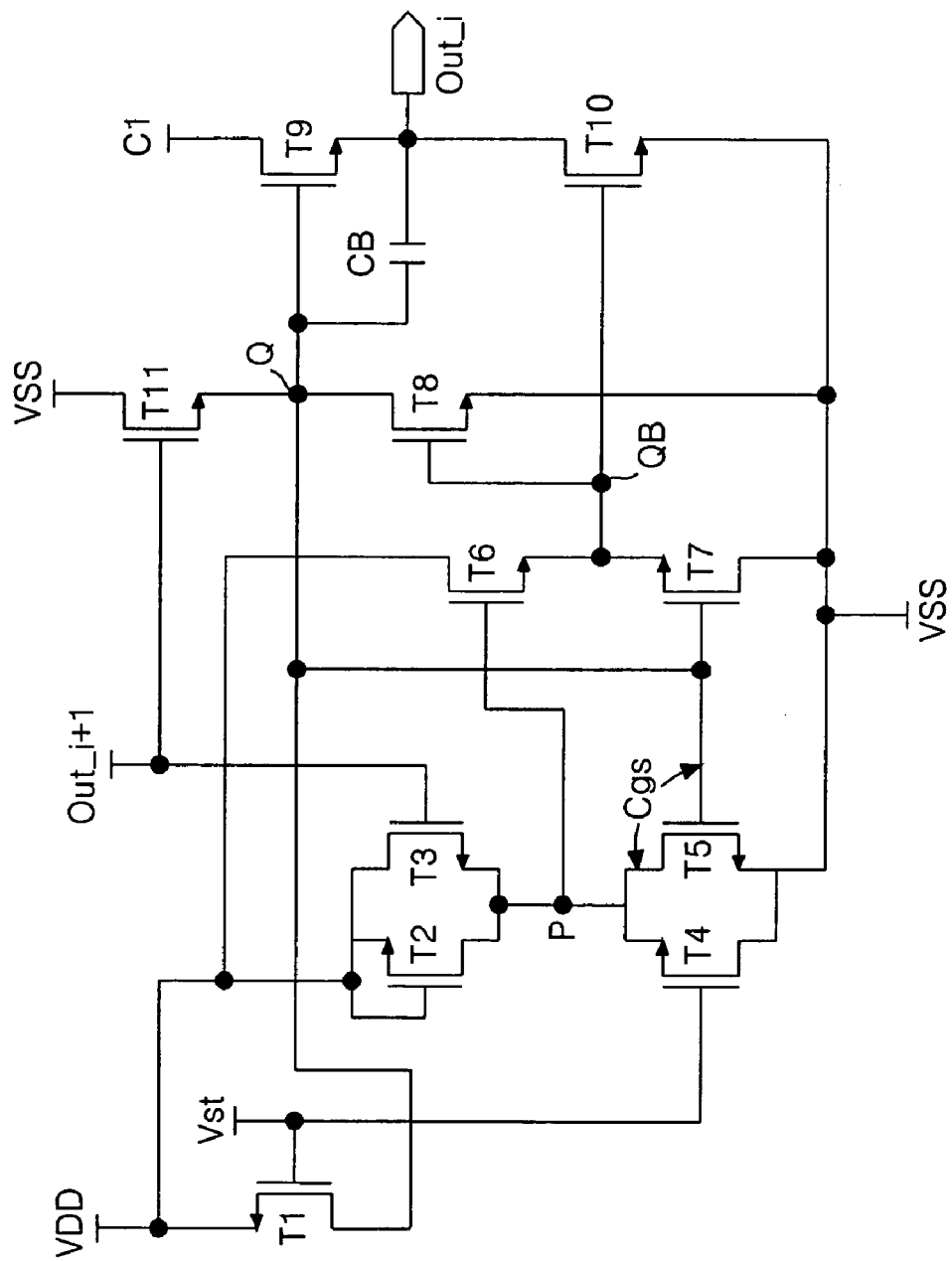
FIG. 4 is a detailed circuit diagram of one stage in a shift register according to a first embodiment of the present invention.
Figure 5:
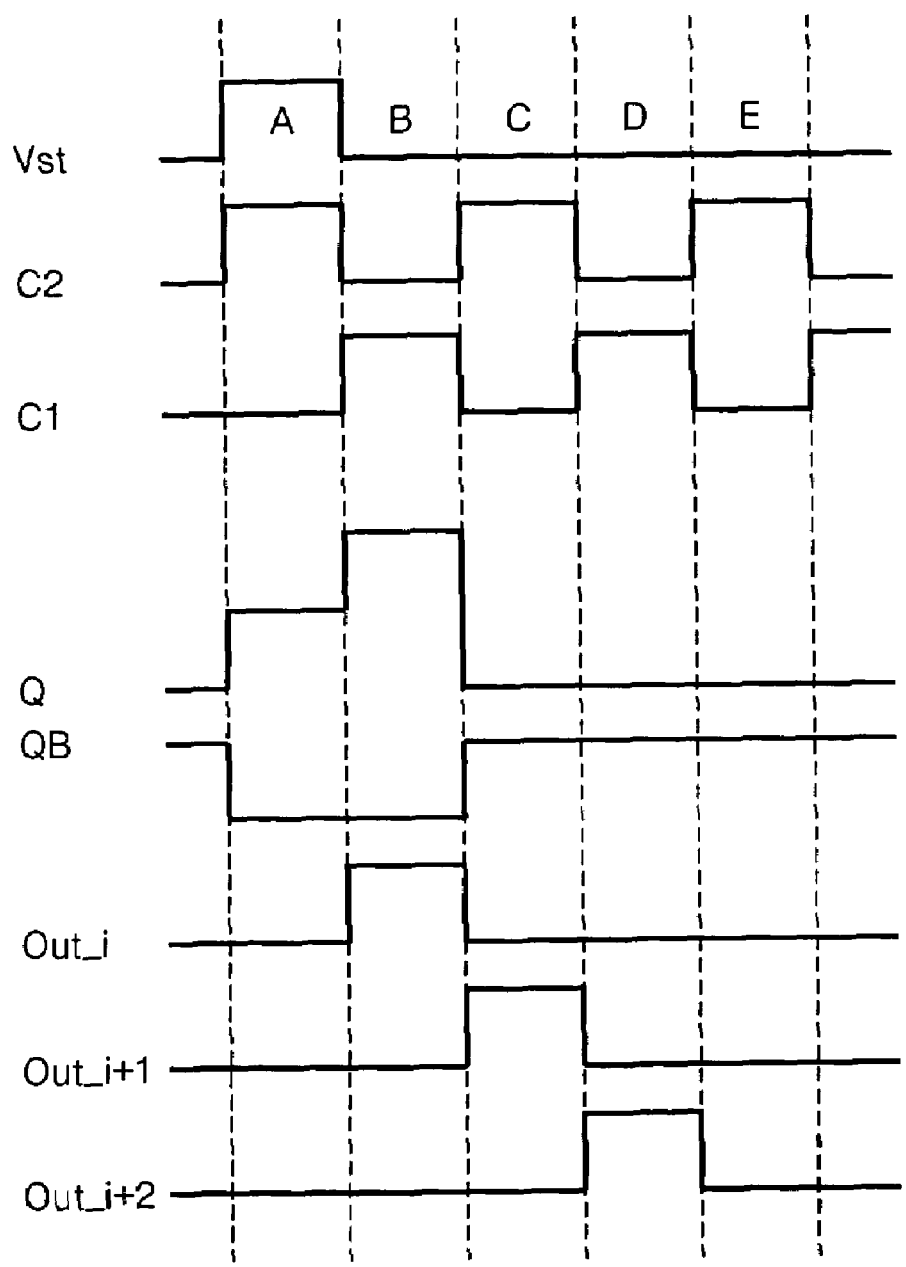
FIG. 5 is a driving waveform diagram of the stage shown in FIG. 4.

FIG. 4 is a detailed circuit diagram of one stage in a shift register according to a first embodiment of the present invention, and FIG. 5 shows driving waveforms thereof.

Referring to FIG. 4, the stage of the shift register includes an output buffer having a ninth NMOS transistor T9 for outputting a first clock signal C1 to an output line under control of a Q node and a tenth NMOS transistor T10 for outputting a low-level driving voltage VSS to the output line under control of a QB node, a pre-charger having a first NMOS transistor T1 for pre-charging the Q node, a first controller having second to seventh NMOS transistors T2 to T7 for controlling the QB node, and a second controller having eighth and eleventh NMOS transistors T8 and T11 for controlling the Q node.

The ninth NMOS transistor T9 of the output buffer is connected between the input line of the first clock signal C1 and the output line of the stage to be controlled by the Q node, and the tenth NMOS transistor T10 is connected between the output line of the stage and the input line of the low-level driving voltage Vss to be controlled by the QB node.

The first NMOS transistor T1 of the pre-charger is connected between the supply line of the high-level driving voltage VDD and the Q node to be controlled by a start pulse Vst.

The second NMOS transistor T2 of the first controller is connected between the supply line of the high-level driving voltage VDD and the P node in a diode type, and the third NMOS transistor T3 is connected, in parallel, to the second NMOS transistor T3 to be controlled by an output signal Out_i+1 of the next stage. The fourth NMOS transistor T4 is connected between the P node and the supply line of the low-level driving voltage VSS to be controlled by the start pulse Vst, and the fifth NMOS transistor T5 is connected, in parallel, to the fourth NMOS transistor T4 to be controlled by the Q node. The sixth NMOS transistor T6 is connected between the input line of the high-level driving voltage VDD and the QB node to be controlled by the P node, and the seventh NMOS transistor T7 is connected between the QB node and the input line of the low-level driving voltage VSS to be controlled by the Q node.

The eighth NMOS transistor T8 of the second controller is connected between the Q node and the input line of the low-level driving voltage VSS to be controlled by the QB node, and the eleventh NMOS transistor T11 is connected, in parallel, to the eighth NMOS transistor T8 to be controlled by an output signal Out_i+1 of the next stage.

Hereinafter, an operation procedure of the stage will be described with reference to driving waveforms shown in FIG. 5.

In an A period, the first NMOS transistor T1 is turned on by a high-state start pulse Vst to thereby apply the high-level driving voltage VDD to the Q node and thus pre-charge it to a high state. The Q node pre-charged into a high state turns on the ninth NMOS transistor T9 to thereby apply a low-state voltage of the first clock signal C1 to the output line. At this time, the P node becomes a low state by the second NMOS transistor T2 always maintaining a turn-on state, the fourth NMOS transistor T4 turned on by the high-state start pulse Vst and the fifth NMOS transistor T5 turned on by the high-state Q node. Thus, the sixth NMOS transistor T6 is turned off while the seventh NMOS transistor T7 is turned on by the high-state Q node to thereby apply the low-level driving voltage VSS to the QB node and thus turn off the tenth NMOS transistor T10. Further, the eighth NMOS transistor T8 is turned off while the eleventh NMOS transistor T11 is turned off by an output signal Out_i+1 with a low state of the next stage. Thus, in the A period, the output line of the stage outputs a low-state output signal Out_i.

In a B period, the first NMOS transistor T1 is turned off by a low-state start pulse Vst to thereby float the Q node into a high state. Thus, the ninth NMOS transistor T9 keeps a turn-on state. At this time, as a high-state voltage is supplied as the first clock signal C1, the floated Q node is bootstrapped by an effect of an internal capacitor Cgs provided between the gate and the drain of the ninth NMOS transistor T9 and a capacitor CB. Accordingly, a voltage at the Q node is further raised to turn on the ninth NMOS transistor T9, thereby rapidly supplying a high-state voltage of the first clock signal C1 to the output line. Further, operations of the second to eighth NMOS transistors T2 to T8 and the tenth and eleventh NMOS transistors T10 and T11 are similar to operations thereof in the A period. Thus, in the B period, the output line of the stage outputs a high-state output signal Out_i.

In a C period, the first and fourth NMOS transistors T1 and T4 are turned off by a low-state start pulse Vst. At this time, the high-level driving voltage VDD is supplied to the P node by the second NMOS transistor T2 keeping a turn-on state to thereby turn on the sixth NMOS transistor T6. Further, the high-level driving voltage VDD is supplied to the QB node by the turned-on sixth NMOS transistor T6, thereby turning on the tenth NMOS transistor T10 to supply the low-level driving voltage VSS to the output line. At this time, the eighth NMOS transistor T8 is turned on by the high-state QB node while the eleventh NMOS transistor T11 is turned on by an output signal Out_i+1 with a high state of the next stage, thereby supplying the low-level driving voltage VSS to the Q node. Thus, the fifth, seventh and ninth NMOS transistors T5, T7 and T9 are turned off by the Q node with a low state. As a result, in the C period, the output line of the stage outputs a high-state output signal Out_i.

In a D period, as the output signal Out_i+1 of the next stage has a low voltage stage in comparison with the C period, the eleventh NMOS transistor T11 is turned off, but the Q node keeps a low state by the turned-on eighth NMOS transistor T8. Thus, like the C period, the P node and the QB node are continuously supplied with the high-level driving voltage VDD by the turned-on second, third and sixth NMOS transistors T2, T3 and T6, so that they can keep an undistorted high state irrespectively of leakage currents of the turned-off NMOS transistors T4, T5 and T7. As a result, the tenth NMOS transistor T10 keeps a normal turn-on state to supply the low-level driving voltage VSS to the output line, so that the output signal Out_i can maintain an undistorted low state.

Furthermore, in the remaining period, the stage operates in similarity to the D period, so that the output signal Out_i of the stage can maintain an undistorted low state.

As mentioned above, the shift register according to the present invention allows the high-level voltage VDD to be supplied to the QB node during most driving times in order to supply a low state voltage to the output line with no distortion. Thus, since the direct current (DC) high-level voltage VDD is applied to the gate electrodes of the eighth and tenth NMOS transistors T8 and T10, the shift register is erroneously operated by gate bias stress when it is operated at a high temperature for a long time.

In order to solve the above-mentioned problem, a shift register according to a second embodiment of the present invention will be described below.

Figure 6:
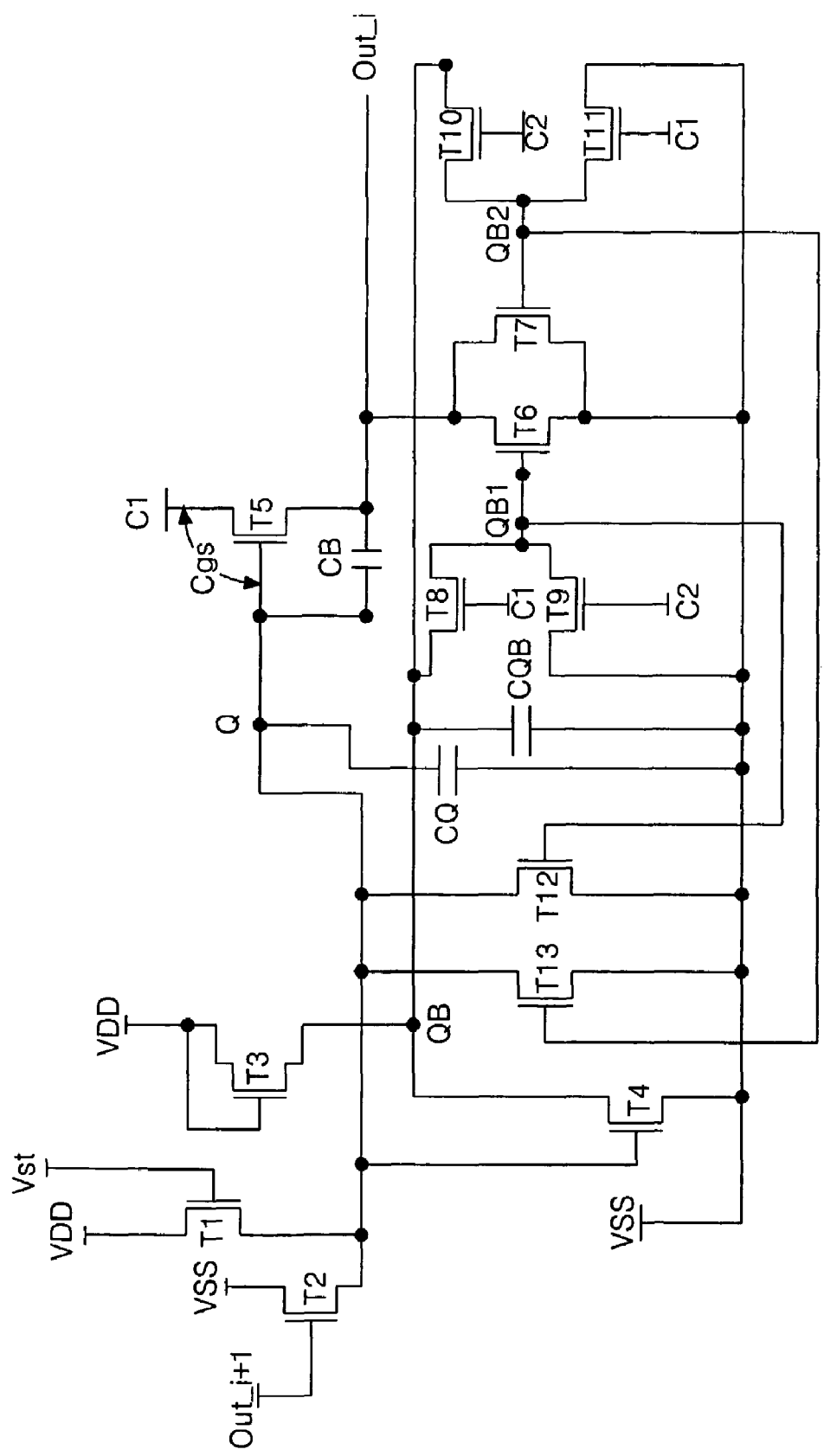
FIG. 6 is a detailed circuit diagram of one stage in a shift register according to a second embodiment of the present invention.
Figure 7:
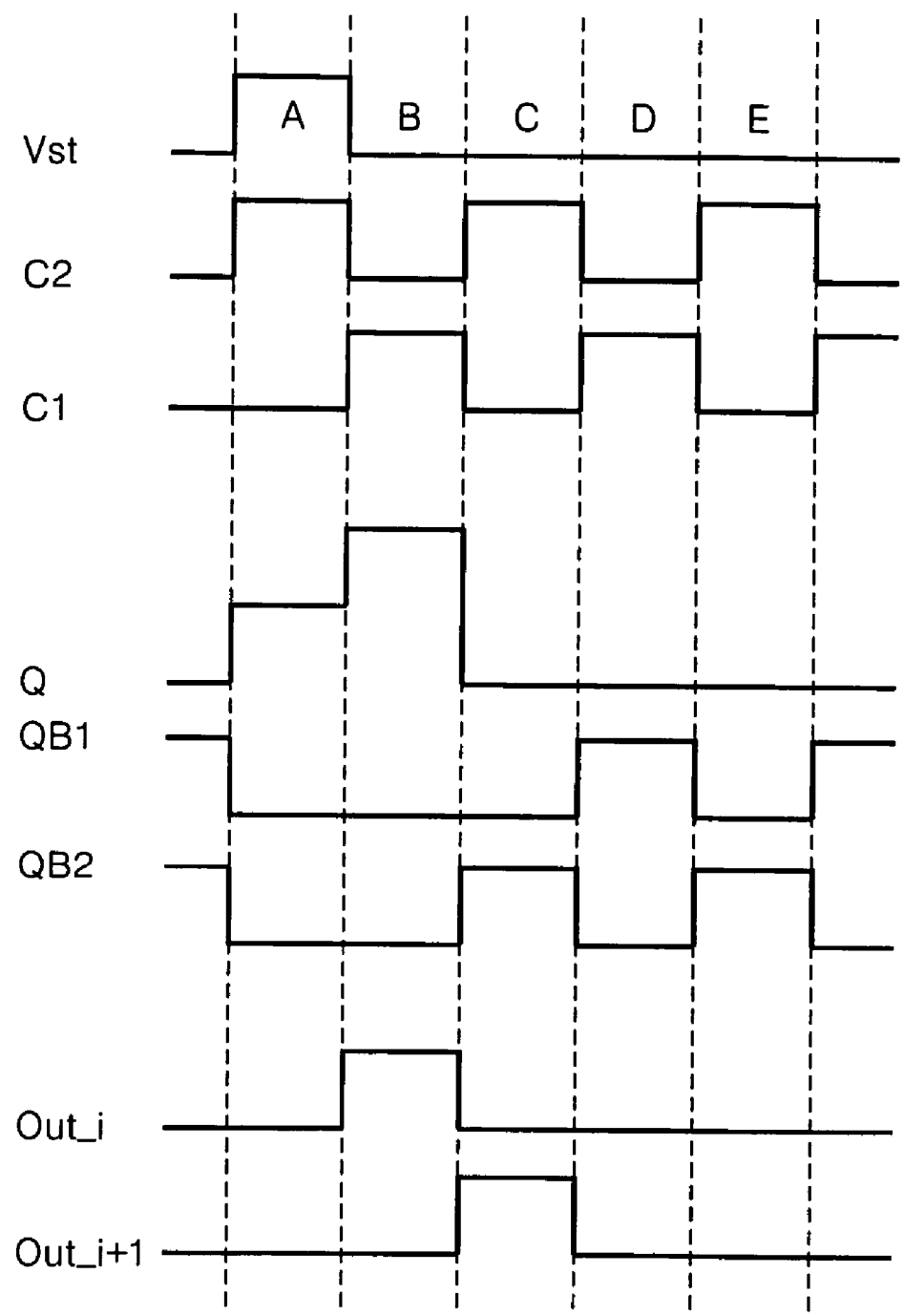
FIG. 7 is a driving waveform diagram of the stage shown in FIG. 6.

FIG. 6 is a detailed circuit diagram of one stage in a shift register according to a second embodiment of the present invention, and FIG. 7 is a driving waveform diagram of the stage shown in FIG. 6.

Referring to FIG. 6, the shift register includes an output buffer having a fifth NMOS transistor T5 for outputting a clock signal C1 to an output line under control of a Q node and sixth and seventh NMOS transistors T6 and T7 for outputting a low-level driving voltage VSS to the output line under control of QB1 and QB2 nodes, a Q node controller having first and second NMOS transistors T1 and T2 and twelfth and thirteenth NMOS transistors T12 and T13 for controlling the Q node, a QB node controller having third and fourth NMOS transistors T3 and T4 for controlling a QB node, a QB1 node controller having eighth and ninth NNOS transistors T8 and T9 for controlling the QB1 node, and a QB2 node controller having tenth and eleventh NMOS transistors T10 and T11 for controlling the QB2 node.

In the output buffer, the fifth NMOS transistor T5 is a pull-up transistor that is connected between an input line of the clock signal C1 and an output line of the stage to be controlled by the Q node. The sixth and seventh NMOS transistors T6 and T7 that are pull-down transistors are connected, in parallel, between the output line of the stage and an input line of a low-level voltage VSS to be controlled by the QB1 node or the QB2 node.

The Q node controller consists of a pre-charger for pre-charging the Q node, and a discharger for discharging it.

The first NMOS transistor T1 in the Q node pre-charger is connected between a supply line of a high-level voltage VDD and the Q node to be controlled by a start pulse Vst.

The Q node discharger includes a second NMOS transistor T2 connected between the supply line of the low-level voltage VSS and the Q node to be controlled by an output signal Out_i+1 of the next stage, and twelfth and thirteenth NMOS transistors T12 and T13 connected, in parallel, between the Q node and the supply line of the low-level voltage VSS to be controlled by the QB1 node or the QB2 node.

The third NMOS transistor T3 in the QB node controller is connected as a diode between the supply line of the high-level driving voltage VDD and the QB node while the fourth NMOS transistor T4 is connected between the QB node and the supply line of the low-level voltage VSS to be controlled by the Q node.

The eighth NMOS transistor T8 in the QB1 node controller is connected between the QB node and the QB1 node to be controlled by a first clock signal C1 while the ninth NMOS transistor T9 is connected between the input line of the low-level voltage VSS and the QB1 node to be controlled by a second clock signal C2.

The tenth NMOS transistor T10 in the QB node controller is connected between the QB node and the QB2 node to be controlled by the second clock signal C2 while the eleventh NMOS transistor T11 is connected between the input line of the low-level voltage VSS and the QB2 node to be controlled by the first clock signal C1.

A capacitor CQ connected between the Q node and the input line of the low-level voltage VSS and a capacitor CQB connected between the QB node and the input line of the low-level voltage VSS remove noise at the Q node and the QB node, respectively.

Hereinafter, an operation procedure of the stage will be described with reference to driving waveforms shown in FIG. 7. Each period may be, for example, a clock pulse.

In an A period, the first NMOS transistor T1 is turned on by a high-state voltage of a start pulse Vst to thereby apply the high-level driving voltage VDD to the Q node and thus pre-charge the Q node into a high state. The pre-charged Q node turns on the fifth NMOS transistor T5 to thereby apply a low-state voltage of the first clock signal C1 to the output line. At the same time, the pre-charged Q node turns on the fourth NMOS transistor T4 and the third NMOS transistor T3. The fourth NMOS transistor T4 is larger than the third NMOS transistor T3, thereby allowing the low-level voltage VSS to arrive at the QB node faster than the high-level voltage VDD. Thus, the QB node becomes a low state. For instance, a magnitude ratio of the third NMOS transistor T3 to the fourth NMOS transistor T4 is approximately 1:3. The ninth and tenth NMOS transistors T9 and T10 are turned on by the second clock signal C2 to thereby apply a low state voltage supplied to the QB node to the QB1 node and apply the low-level voltage VSS to the QB2 node. Thus, the sixth and seventh NMOS transistors T6 and T7 and the twelfth and thirteenth NMOS transistors T12 and T13 are turned off. Accordingly, only the fifth NMOS transistor T5 is turned on to thereby apply the low-level voltage to the output line. As a result, in the A period, the output line of the stage outputs a low-state output signal Out_i.

In a B period, the first NMOS transistor T1 is turned off by a low-state voltage of the start pulse Vst to thereby float the Q node into a high state. Thus, the fifth NMOS transistor T5 maintained in a turn-on state. At this time, as a high-state voltage of the first clock signal C1 is supplied, the floated Q node is boot-strapped by an effect of a capacitor CGS provided between the gate electrode and the drain electrode of the fifth NMOS transistor T5 and capacitor CB. Accordingly, a voltage at the Q node is further raised to turn on the fifth NMOS transistor T5, thereby rapidly supplying a high-state voltage of the first clock signal C1 to the output line. At this time, the QB node becomes a low state by the fourth NMOS transistor T4 turned on by the boot-strapped Q node even though the third NMOS transistor T3 remains in a turn-on state. Further, the eighth and eleventh NMOS transistors T8 and T11 are turned on by the first clock signal C1 to thereby apply a low-state voltage supplied to the QB node to the QB1 node and apply the low-level voltage VSS to the QB2 node. Thus, the sixth and seventh NMOS transistors T6 and T7 and the twelfth and thirteenth NMOS transistors T12 and T13 are turned off. As a result, in the B period, the output line of the stage outputs a high-state output signal Out_i.

In a C period, the second NMOS transistor T2 is turned on by a high-state voltage of an output signal Out_i+1 of the next stage to thereby supply the low-level voltage VSS to the Q node. Thus, the fifth NMOS transistor T5 is turned off. Further, the fourth NMOS transistor T4 is turned off by the low-level voltage VSS at the Q node to thereby apply the high-level voltage VDD, via the third NMOS transistor T3 remaining in a turn-on state to the QB node. Then, the ninth and tenth NMOS transistors T9 and T10 are turned on by the second clock signal C2 to thereby apply the low-level driving voltage VSS to the QB1 node and apply the high-level driving voltage VDD supplied to the QB node to the QB2 node. Thus, the seventh NMOS transistor T7 is turned on to thereby supply the low-level driving voltage VSS to the output line. Further, the thirteenth NMOS transistor T13 is turned on to thereby supply the low-level driving voltage VSS to the Q node. Thus, the output signal Out_i+1 of the next stage becomes a low state, thereby allowing the Q node to be in a low state even though the second NMOS transistor T2 is turned off. As a result, in the C period, the output line of the stage outputs a low-state output signal Out_i.

In a D period, the first and second NMOS transistors T1 and T2 are turned off by low voltages of the start pulse Vst and the output signal Out_i+1 of the next stage. Thus, the low-state voltage at the Q node turns off the fourth NMOS transistor T4 to thereby apply the high-level voltage VDD, via the third NMOS transistor T3 remaining in a turn-on state, to the QB node. Further, the eighth and eleventh NMOS transistors T8 and T11 are turned on by the first clock signal C1 to thereby apply the high-level voltage VDD supplied to the QB node to the QB1 node and apply the low-level voltage to the QB2 node. Also, the twelfth NMOS transistor T12 is turned on to thereby supply the low-level driving voltage VSS to the Q node. Thus, the Q node is in a low state even though the first and second NMOS transistors T1 and T2 are turned off. As a result, in the D period, the output line of the stage outputs a low-state output signal Out_i.

Furthermore, in the remaining periods, the stage operates similar to the C and D periods, so that the output signal Out of the stage can maintain a low state.

As mentioned above, in the shift register according to the embodiment of the present invention, the seventh NMOS transistor T7 and sixth NMOS transistor T6 are connected in parallel and operate oppositely as the QB1 and QB2 nodes connected to the gate electrodes thereof are driven in an alternating basis in response to the first and second clock signals, thereby preventing an erroneous operation caused by gate bias stress. Furthermore, the gate electrodes of the twelfth and thirteenth NMOS transistors T12 and T13 for holding the Q node in a low-state voltage are alternating driven by the QB1 and QB2 nodes, thereby preventing an erroneous operation caused by gate bias stress.

As described above, the present shift register uses alternating current (AC) driving of the gate electrodes of the sixth and seventh NMOS transistors T6 and T7 to supply the low-level voltage VSS to the output line during a majority of periods. Furthermore, the shift register uses an AC driving of the gate electrodes of the twelfth and thirteenth NMOS transistors T12 and T13 to supply the low-level voltage VSS to the Q node. Accordingly, a direct current (DC) bias is not applied to the gate electrodes of the sixth and seventh NMOS transistors T6 and T7 and the gate electrodes of the twelfth and thirteenth NMOS transistors T12 and T13, so that it becomes possible to prevent erroneous operation caused by gate bias stress upon driving thereof at a high temperature.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A shift register having a plurality of stages for shifting an input start pulse using first and second driving voltages and first and second clock signals to apply the shifted start pulse as each output signal and a next stage start pulse, each of the plurality of stages comprising:
    an output buffer for applying the first clock signal to an output line under control of a first node and for applying the second driving voltage to the output line under control of second and third nodes;
    a first node controller for controlling the first node using the start pulse and an output signal of the next stage;
    a second node controller for selectively applying a voltage at a fourth node and the second driving voltage to the second node under control of the first and second clock signals;
    a third node controller for applying the voltage at the fourth node and the second driving voltage to the third node that is opposite to the second node under control of the first and second clock signals; and
    a fourth node controller for controlling the fourth node such that the fourth node has a voltage opposite to the first node using a voltage at the first node and the first driving voltage.

2. The shift register according to claim 1, wherein the first and second clock signals have phases that are inverted with respect to each other.

3. The shift register according to claim 1, wherein the first and second clock signals are alternately applied to the plurality of stages.

4. The shift register according to claim 1, wherein the first driving voltage is higher than the second driving voltage.

5. The shift register according to claim 1, wherein the first node controller includes:
    a first transistor connected between an input line of the first driving voltage and the first node, the first transistor controlled by the start pulse; and a second transistor connected between an input line of the second driving voltage and the first node, the second transistor controlled by an output signal of the next stage.

6. The shift register according to claim 5, wherein the fourth node controller includes:
a third transistor connected between the input line of the first driving voltage and the fourth node, the third transistor connected so as to operate as a diode; and
a fourth transistor connected between the fourth node and the input line of the second driving voltage, the fourth transistor controlled by the first node.

7. The shift register according to claim 6, wherein the fourth transistor is larger than the third transistor.

8. The shift register according to claim 6, wherein a magnitude ratio of the third transistor to the fourth transistor is approximately 1:3.

9. The shift register according to claim 6, wherein the output buffer includes:
a fifth transistor connected between the input line of the first clock signal and the output line of the stage, the fifth transistor controlled by the first node;
a sixth transistor connected between the output line of the stage and the input line of the second driving voltage, the sixth transistor controlled by the second node; and
a seventh transistor connected in parallel to the sixth transistor, the seventh transistor controlled by the third node.

10. The shift register according to claim 9, wherein the output buffer includes:
a capacitor connected to the fifth transistor to bootstrap the first node using the first clock signal.

11. The shift register according to claim 9, wherein the second node controller includes:
an eighth transistor connected between the fourth node and the second node, the eight transistor controlled by the first clock signal; and
a ninth transistor connected between the input line of the second driving voltage and the second node, the ninth transistor controlled by the second clock signal.

12. The shift register according to claim 11, wherein the third node controller includes:
a tenth transistor connected between the fourth node and the third node, the tenth transistor controlled by the second clock signal; and
an eleventh transistor connected between the input line of the second driving voltage and the third node, the eleventh transistor controlled by the second clock signal.

13. The shift register according to claim 10, wherein the first node controller includes:
a twelfth transistor connected between the first node and the input line of the second driving voltage, the twelfth transistor controlled by the second node; and
a thirteenth transistor connected in parallel to the twelfth transistor, the thirteenth transistor controlled by the third node.

14. The shift register according to claim 1, wherein the stage is configured by the same channel-type transistor.

15. The shift register according to claim 1, wherein the stage is configured by NMOS transistors.

16. The shift register according to claim 1, wherein the stage is configured by an amorphous-silicon thin film transistor.

17. A method of providing a shifted input start pulse from a shift register having a current stage and a next stage, the method comprising:

applying multiple driving voltages and clock signals as well as an input start pulse to the current stage of the shift register;
controlling a buffer to supply one of the clock signals as an output signal of the current stage during a particular period and supplies one of the multiple driving voltages as the output signal during times other than the particular period;
controlling multiple controllers in the current stage using the input start pulse, an output signal of the next stage, the clock signals, the driving voltages, or a voltage at one of multiple nodes internal to the current stage;
for each controller: limiting a voltage supplied to a gate of at least one transistor supplying one of the driving voltages as the output signal during times other than the particular period in the buffer and limiting time that the voltage is supplied to the transistor to a voltage and time less than that causing bias stress on the transistor; and
shifting the input start pulse in time and supplying the shifted input start pulse as the output signal of the current stage to an input start pulse of the next stage.

18. The method according to claim 17, further comprising for each controller: limiting the voltage supplied to the controller to a voltage that is at most as large as about one of the driving voltages and limiting the time the voltage is supplied to the controller to at most about that of one clock pulse.

19. The method according to claim 17, further comprising switching voltages supplied to first internal nodes of the current stage between voltages of a second internal node of the current stage and one of the driving voltages using the clock signals.

20. The method according to claim 19, further comprising alternating the voltages supplied to the first internal nodes such that when one of the first internal nodes is supplied with the voltage of the second internal node, another of the first internal nodes is supplied with the one of the driving voltages.

21. The method according to claim 17, further comprising supplying an input of the buffer with the driving voltages at different times.

22. The method according to claim 21, further comprising using the input start pulse to supply one of the driving voltages and an output signal of the next stage to supply another of the output voltages to the input of the buffer.

23. The method according to claim 21, further comprising supplying one of the driving voltages to the input of the buffer using parallel switches controlled by different internal nodes of the current stage.

24. A shift register having a plurality of stages supplied with an input start pulse, clock signals and driving voltages, a current stage of the plurality of stages comprising:
multiple controllers controlled using the input start pulse, an output signal of a next stage, the clock signals, the driving voltages, or a voltage at one of multiple nodes internal to the current stage;
a buffer that supplies one of the clock signals as an output signal during a particular period and supplies one of the driving voltages as the output signal during times other than the particular period; and
for each controller: limiting a voltage supplied to a gate of at least one transistor supplying one of the driving voltages as the output signal during times other than the particular period in the buffer and limiting time that the voltage is supplied to the transistor to a voltage and time less than that causing bias stress on the transistor.

25. The shift register according to claim 24, wherein the limiting means limits the voltage to at most as large as about one of the driving voltages and the time to at most about that of one clock pulse.

26. The shift register according to claim 24, wherein first internal nodes are connected with a second internal node and one of the driving voltages.

27. The shift register according to claim 26, wherein the first internal nodes are connected with the clock signals such that when one of the first internal nodes outputs a voltage of the second internal node, another of the first internal nodes outputs the one of the driving voltages.

28. The shift register according to claim 25, wherein an input of the buffer is connected with the driving voltages at different times, the input of the buffer controlling supply of the one of the clock signals as the output signal.

29. The shift register according to claim 28, wherein a controller has a pair of transistors that have outputs connected with the buffer, a first of the pair of transistors having a first input connected with one of the driving voltages and a second input connected with the input start pulse, and a second of the pair of transistors having a first input connected with another of the driving voltages, and a second input connected with an output signal of the next stage, the second inputs of the first and second transistors controlling supply of the first inputs to the outputs.

30. The shift register according to claim 28, wherein the input of the buffer is connected with one of the driving voltages through parallel controllers, inputs of the parallel controllers controlling the outputs of the parallel controllers connected with different internal nodes.

31. A shift register having a plurality of stages for shifting an input start pulse to apply the shifted start pulse as each output signal, each of the plurality of stages comprising:

a first transistor connected between a first clock signal and an output line, applying the first clock signal to the output line during a particular period;

a pair of transistors connected in parallel between the output line and a low-level driving voltage, applying the low-level driving voltage during times other than the particular period; and wherein the first transistor and the pair of transistors are controlled by multiple controllers in a current stage using the input start pulse, the low-level driving voltage, a high-level driving voltage, the first clock signal, a second clock signal having a voltage opposite to the first clock signal and an output signal of a next stage, the multiple controllers limiting voltages supplied to each gate the pair of transistors and time that the voltages are supplied to each gate to a voltage and time less than that causing bias stress on each gate.

* * * * *